US010332766B2

(12) United States Patent
Sasaki (10) Patent No.: US 10,332,766 B2
(45) Date of Patent: Jun. 25, 2019

(54) SUBSTRATE PROCESSING APPARATUS AND SUBSTRATE TRANSFER METHOD

(71) Applicant: Tokyo Electron Limited, Tokyo (JP)

(72) Inventor: Yuji Sasaki, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 7 days.

(21) Appl. No.: 15/696,513

(22) Filed: Sep. 6, 2017

(65) Prior Publication Data

US 2018/0082875 A1 Mar. 22, 2018

(30) Foreign Application Priority Data

Sep. 16, 2016 (JP) .................................. 2016-181762

(51) Int. Cl.
| | | |
|---|---|---|
| H01L 21/00 | (2006.01) | |
| H01L 21/673 | (2006.01) | |
| H01L 21/677 | (2006.01) | |
| H01L 21/67 | (2006.01) | |

(52) U.S. Cl.
CPC .. *H01L 21/67389* (2013.01); *H01L 21/67253* (2013.01); *H01L 21/67393* (2013.01); *H01L 21/67754* (2013.01); *H01L 21/67757* (2013.01); *H01L 21/67769* (2013.01); *H01L 21/67772* (2013.01)

(58) Field of Classification Search
CPC ......... H01L 21/67389; H01L 21/67253; H01L 21/67393; H01L 21/67754; H01L 21/67757; H01L 21/67769; H01L 21/67772
See application file for complete search history.

(56) References Cited

U.S. PATENT DOCUMENTS

| | | | | |
|---|---|---|---|---|
| 6,267,158 B1* | 7/2001 | Saga | ................. | H01L 21/67253 |
| | | | | 141/65 |
| 8,806,370 B2* | 8/2014 | Nogami | .............. | G06F 3/04847 |
| | | | | 700/121 |
| 2009/0297298 A1* | 12/2009 | Okabe | ............... | H01L 21/67276 |
| | | | | 414/217.1 |

(Continued)

FOREIGN PATENT DOCUMENTS

| | | |
|---|---|---|
| JP | 2000-340641 A | 12/2000 |
| WO | WO-2017022431 A1 * | 2/2017 ........... H01L 21/677 |

*Primary Examiner* — Brian W Wathen
*Assistant Examiner* — Brian T McMenemy
(74) *Attorney, Agent, or Firm* — Abelman, Frayne & Schwabe (57) ABSTRACT

A substrate processing apparatus includes: a substrate conveyance area; a substrate storage conveyance area; a substrate storage storing shelf; a first purge gas supply unit that supplies a purge gas into the substrate storage on the substrate storage storing shelf; an integrated flow rate acquiring unit that acquires an integrated flow rate of the purge gas supplied into the substrate storage; a transfer and placement unit; a second purge gas supply unit that supplies a purge gas into the substrate storage placed on the transfer and placement unit; a substrate transfer unit that transfers the substrate into the substrate conveyance area when the substrate storage is opened; and a controller that calculates an oxygen concentration within the substrate storage based on the integrated flow rate of the purge gas, and transfers the substrate to the substrate conveyance area when the oxygen concentration is a threshold value or less.

18 Claims, 6 Drawing Sheets

(56) References Cited

U.S. PATENT DOCUMENTS

| | | | | |
|---|---|---|---|---|
| 2012/0083918 A1* | 4/2012 | Yamazaki | ......... | H01L 21/67389 700/112 |
| 2014/0141541 A1* | 5/2014 | Tsai | ................. | H01L 21/67253 438/14 |
| 2015/0170945 A1* | 6/2015 | Segawa | ............. | H01L 21/67017 414/217 |
| 2015/0369643 A1* | 12/2015 | Murata | ..................... | G01F 1/56 73/861.08 |
| 2016/0155630 A1* | 6/2016 | Tsubota | ............ | H01L 21/67207 438/738 |
| 2016/0358799 A1* | 12/2016 | Murata | ............. | H01L 21/67389 |
| 2018/0229277 A1* | 8/2018 | Onishi | ..................... | B08B 5/02 |

* cited by examiner

SUBSTRATE PROCESSING APPARATUS AND SUBSTRATE TRANSFER METHOD

CROSS-REFERENCE TO RELATED APPLICATIONS

This application is based on and claims priority from Japanese Patent Application No. 2016-181762 filed on Sep. 16, 2016 with the Japan Patent Office, the disclosure of which is incorporated herein in its entirety by reference.

TECHNICAL FIELD

The present disclosure relates to a substrate processing apparatus and a substrate transfer method.

BACKGROUND

In the related art, there has been known a substrate processing apparatus in which in a state where a substrate storage is loaded on a substrate storage temporary shelf, an inert gas is supplied/discharged into/from the substrate storage (see, e.g., Japanese Patent Laid-Open Publication No. 2000-340641). The substrate processing apparatus disclosed in Japanese Patent Laid-Open Publication No. 2000-340641 is configured such that an inert gas inlet port and an atmosphere outlet port for flowing out atmosphere within the substrate storage are formed in a bottom plate of the closed-type substrate storage, an inert gas supply port and an atmosphere discharge port for discharging the atmosphere within the substrate storage are formed on the shelf of the substrate storage, the inert gas inlet port and the inert gas supply port may be fitted to each other, and the atmosphere outlet port and the atmosphere discharge port for flowing out and may be fitted to each other. Then, in the configuration of the substrate processing apparatus, an inert gas supply source is connected to the inert gas supply port, an open/close valve is provided in each of the inert gas inlet port, and the atmosphere outlet port, a solenoid valve is provided in a pipe between the inert gas supply port and the inert gas supply source, and each of the open/close valves and the solenoid valve is opened when the substrate storage is placed on the substrate storage temporary shelf.

According to Japanese Patent Laid-Open Publication No. 2000-340641, it is described that through the above-described configuration, since an inert gas is supplied into the substrate storage in a state where the substrate storage is loaded on the substrate storage temporary shelf, it is possible to suppress a natural oxide film from being generated on a substrate in a state where the substrate storage is stored in the substrate processing apparatus, to omit a step of filling the inert gas into the substrate storage during of the conveyance of the substrate storage, which has conventionally been performed to prevent natural oxidation of the substrate, and to shorten a carry-in/-out time of the substrate storage.

SUMMARY

According to an aspect of the present disclosure, there is provided a substrate processing apparatus including: a substrate conveyance area having a first oxygen concentration, in which a substrate is conveyable in an exposed state; a substrate storage conveyance area formed adjacent to the substrate conveyance area via a partition wall, and having a second oxygen concentration higher than the first oxygen concentration, in which the substrate held within a substrate storage is conveyable; a substrate storage storing shelf provided within the substrate storage conveyance area and configured to temporarily store the substrate storage; a first purge gas supply unit configured to supply a purge gas into the substrate storage stored on the substrate storage storing shelf; an integrated flow rate acquiring unit configured to acquire an integrated flow rate of the purge gas supplied into the substrate storage from the first purge gas supply unit; a conveyance unit configured to convey the substrate storage within the substrate storage conveyance area; a transfer and placement unit provided at a predetermined place adjacent to the partition wall within the substrate storage conveyance area, on which the substrate storage is placed to be transferred to the substrate conveyance area; a second purge gas supply unit configured to supply a purge gas into the substrate storage placed on the transfer and placement unit; a substrate transfer unit configured to transfer the substrate into the substrate conveyance area when the substrate storage is opened in a state where the substrate storage placed on the transfer and placement unit is in close contact with the partition wall; and a controller is configured to: calculate an oxygen concentration within the substrate storage placed on the transfer and placement unit based on the integrated flow rate of the purge gas acquired by the integrated flow rate acquiring unit; transfer the substrate to the substrate conveyance area by the substrate transfer unit when the oxygen concentration is a predetermined threshold value or less; supply the purge gas into the substrate storage by the second purge gas supply unit when the oxygen concentration exceeds the predetermined threshold value; and transfer the substrate to the substrate conveyance area by the substrate transfer unit after the oxygen concentration within the substrate storage becomes the predetermined threshold value or less.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In the configuration disclosed in Japanese Patent Laid-Open Publication No. 2000-340641, no consideration is given to how to manage the oxygen concentration and the humidity within the substrate storage. Thus, when a substrate is taken out from the substrate storage and transferred into the substrate transfer chamber, the substrate storage is opened in a state where the substrate storage is in close contact with a wall surface of a substrate transfer chamber. Thus, oxygen may be mixed into the substrate transfer chamber when the oxygen concentration within the substrate storage is not sufficiently lowered. In order to suppress such mixing of the oxygen, when the substrate storage is placed on the substrate storage temporary shelf for a long time in order to sufficiently lower the oxygen concentration within the substrate storage, the productivity may be deteriorated.

Meanwhile, when an oxygen concentration measuring device that measures the oxygen concentration within the substrate storage is introduced in order to properly manage the oxygen concentration within the substrate storage, it takes a time to measure oxygen, which may also deteriorate the productivity.

Therefore, the present disclosure provides a substrate processing apparatus and a substrate transfer method, which are capable of properly managing an oxygen concentration within a substrate storage without deteriorating the productivity.

According to an aspect of the present disclosure, there is provided a substrate processing apparatus including: a substrate conveyance area having a first oxygen concentration, in which a substrate is conveyable in an exposed state; a substrate storage conveyance area formed adjacent to the substrate conveyance area via a partition wall, and having a second oxygen concentration higher than the first oxygen concentration, in which the substrate held within a substrate storage is conveyable; a substrate storage storing shelf provided within the substrate storage conveyance area and configured to temporarily store the substrate storage; a first purge gas supply unit configured to supply a purge gas into the substrate storage stored on the substrate storage storing shelf; an integrated flow rate acquiring unit configured to acquire an integrated flow rate of the purge gas supplied into the substrate storage from the first purge gas supply unit; a conveyance unit configured to convey the substrate storage within the substrate storage conveyance area; a transfer and placement unit provided at a predetermined place adjacent to the partition wall within the substrate storage conveyance area, on which the substrate storage is placed to be transferred to the substrate conveyance area; a second purge gas supply unit configured to supply a purge gas into the substrate storage placed on the transfer and placement unit; a substrate transfer unit configured to transfer the substrate into the substrate conveyance area when the substrate storage is opened in a state where the substrate storage placed on the transfer and placement unit is in close contact with the partition wall; and a controller configured to: calculate an oxygen concentration within the substrate storage placed on the transfer and placement unit based on the integrated flow rate of the purge gas acquired by the integrated flow rate acquiring unit; transfer the substrate to the substrate conveyance area by the substrate transfer unit when the oxygen concentration is a predetermined threshold value or less; supply the purge gas into the substrate storage by the second purge gas supply unit when the oxygen concentration exceeds the predetermined threshold value; and transfer the substrate to the substrate conveyance area by the substrate transfer unit after the oxygen concentration within the substrate storage becomes the predetermined threshold value or less.

In the above-described substrate processing apparatus, the predetermined threshold value is set to a concentration that is higher than the first oxygen concentration but does not change the first oxygen concentration of the substrate conveyance area to a concentration at which a natural oxide film is formed on a surface of the substrate even when the substrate storage is opened.

In the above-described substrate processing apparatus, the integrated flow rate acquiring unit is provided within the controller, and the controller is configured to control an operation of the first purge gas supply unit and an operation of the conveyance unit as well.

The above-described substrate processing apparatus further includes a substrate storage storing detection unit configured to detect that the substrate storage is stored on the substrate storage storing shelf. When storing of the substrate storage is detected by the substrate storage storing detection unit, the controller initiates a supply of the purge gas by the first purge gas supply unit.

In the above-described substrate processing apparatus, the controller is configured to stop a supply of the purge gas from the first purge gas supply unit when it is determined that the oxygen concentration within the substrate storage stored on the substrate storage storing shelf reaches a predetermined second threshold value based on the acquired integrated flow rate.

In the above-described substrate processing apparatus, the controller is configured to calculate the oxygen concentration within the substrate storage based on a time during which the supply of the purge gas is stopped and the acquired integrated flow rate.

In the above-described substrate processing apparatus, the predetermined threshold value and the second threshold value are set to a same concentration.

The above-described substrate processing apparatus further includes a substrate storage placement detection unit configured to detect that the substrate storage is placed on the transfer and placement unit. The controller is configured to calculate the oxygen concentration when placement of the substrate storage is detected by the substrate storage placement detection unit.

In the above-described substrate processing apparatus, the controller is configured to calculate the oxygen concentration within the substrate storage based on an oxygen replacement characteristic according to a supply of the purge gas from the first purge gas supply unit and an oxygen concentration retention characteristic when the supply of the purge gas is stopped at the substrate storage storing shelf, and an oxygen replacement characteristic according to a supply of the purge gas from the second purge gas supply unit in the transfer and placement unit which are measured in advance.

In the above-described substrate processing apparatus, the oxygen replacement characteristic according to the supply of the purge gas from the first purge gas supply unit and the oxygen concentration retention characteristic when the supply of the purge gas is stopped, and the oxygen replacement characteristic according to the supply of the purge gas from the second purge gas supply unit in the transfer and placement unit are characteristics in which a horizontal axis is a time, and a vertical axis is an oxygen concentration.

In the above-described substrate processing apparatus, the purge gas is nitrogen gas.

In the above-described substrate processing apparatus, a plurality of substrate storage storing shelves are provided.

In the above-described substrate processing apparatus, the substrate storage is an FOUP that has an openable lid provided on a front side thereof, and is configured to accommodate a plurality of substrates, and the substrate transfer unit is configured to open the lid to open the substrate storage.

In the above-described substrate processing apparatus, a processing container configured to process the substrate is provided in the substrate conveyance area.

In the above-described substrate processing apparatus, the processing container is a reaction tube configured to perform a heat treatment, a substrate holder configured to be accommodatable in the reaction tube while holding a plurality of substrates is provided in the substrate conveyance area, and the substrate transfer unit is configured to transfer the substrate from the substrate storage to the substrate holder.

According to another aspect of the present disclosure, there is provided a substrate transfer method including: temporarily storing a substrate storage accommodating a substrate on a substrate storage storing shelf provided within a substrate storage conveyance area; supplying a purge gas into the substrate storage stored on the substrate storage storing shelf; calculating an integrated flow rate of the purge gas supplied into the substrate storage; placing the substrate on a transfer and placement unit within the substrate storage conveyance area provided adjacent to a partition wall configured to partition a substrate conveyance area and the substrate storage conveyance area in order to transfer the substrate to the substrate conveyance area in which the substrate is conveyable in an exposed state; calculating an oxygen concentration within the substrate storage placed on the transfer and placement unit based on the integrated flow rate of the purge gas, transferring the substrate into the substrate conveyance area by opening the substrate storage in a state where the substrate storage is in close contact with the partition wall when the oxygen concentration is a predetermined threshold value or less, supplying the purge gas into the substrate storage when the oxygen concentration exceeds the predetermined threshold value, and transferring the substrate to the substrate conveyance area after the oxygen concentration within the substrate storage becomes the predetermined threshold value or less.

In the above-described substrate transfer method, the predetermined threshold value is set to a concentration that is higher than an oxygen concentration within the substrate conveyance area, but does not change the oxygen concentration within the substrate conveyance area to a concentration at which a natural oxide film is formed on a surface of the substrate even when the substrate storage is opened.

The above-described substrate transfer method further including: stopping a supply of the purge gas when it is determined that the oxygen concentration within the substrate storage stored on the substrate storage storing shelf reaches a predetermined second threshold value in the calculating of the integrated flow rate of the purge gas supplied into the substrate storage. In the calculating of the oxygen concentration within the substrate storage placed on the transfer and placement unit based on the integrated flow rate of the purge gas, the oxygen concentration within the substrate storage is calculated in consideration of a time during which the supply of the purge gas is stopped.

In the above-described substrate transfer method, the oxygen concentration within the substrate storage placed on the transfer and placement unit is calculated based on an oxygen replacement characteristic according to a supply of the purge gas and an oxygen concentration retention characteristic when the supply of the purge gas is stopped at the substrate storage storing shelf, and an oxygen replacement characteristic according to a supply of the purge gas in the transfer and placement unit. The oxygen replacement characteristic, the oxygen concentration retention characteristic, and the oxygen replacement characteristic are measured in advance.

In the above-described substrate transfer method, the oxygen replacement characteristic according to the supply of the purge gas, the oxygen concentration retention characteristic when the supply of the purge gas is stopped at the substrate storage storing shelf, and the oxygen replacement characteristic according to the supply of the purge gas in the transfer and placement unit are characteristics in which a horizontal axis is a time, and a vertical axis is an oxygen concentration.

According to the present disclosure, it is possible to properly manage an oxygen concentration within a substrate storage without lowering the productivity.

Hereinafter, an exemplary embodiment of the present disclosure will be described with reference to accompanying drawings.

Figure 1:
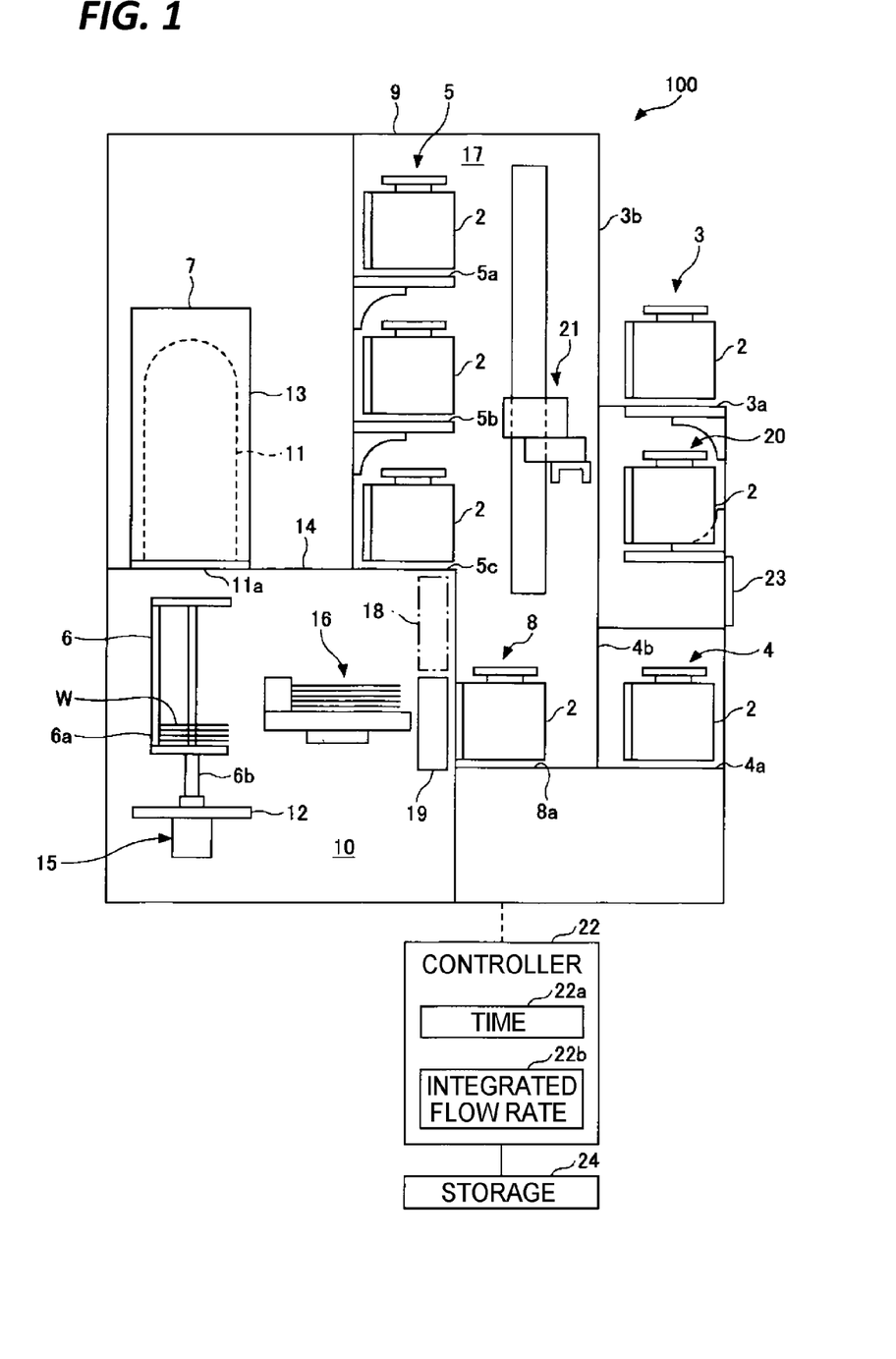
FIG. 1 is a vertical sectional view schematically illustrating a substrate processing apparatus according to an exemplary embodiment of the present disclosure.

FIG. 1 is a vertical sectional view schematically illustrating a substrate processing apparatus according to an exemplary embodiment of the present disclosure. In FIG. 1, the substrate processing apparatus is configured as a vertical heat treatment apparatus that has a vertically elongated processing chamber, and thermally processes substrates, but the substrate processing apparatus according to the present disclosure may be applied to another substrate processing apparatus that performs another substrate processing. In the exemplary embodiment, as an example of a substrate processing apparatus, for example, a substrate processing apparatus configured as a vertical heat treatment apparatus will be described.

As illustrated in FIG. 1, a vertical heat treatment apparatus 100 includes a substrate storage 2, load ports 3 and 4, a substrate storage temporary shelf 5, a front-opening interface mechanical standard (FIMS) port 8, a substrate holder 6, and a heat treatment furnace 7. The vertical heat treatment apparatus 100 is entirely surrounded by a casing 9, and includes a substrate storage conveyance area 17 in which substrates W are conveyed in the state of being accommodated in the substrate storages 2, and a substrate conveyance area 10 in which the substrates W are conveyed in an exposed state.

The substrate storage 2 is an accommodation container (or a transport container) that accommodates and transports the substrates W. The substrate storage 2 may accommodate a plurality of substrates W, and may be configured to accommodate, for example, 25 substrates W. More specifically, the substrate storage 2 is configured as a close type transport container in which a plurality of substrates in a horizontal state may be accommodated in multiple stages in a vertical direction at predetermined intervals within a container main body, and a lid (not illustrated) is detachably provided on the front side of the container main body. The substrate storage 2 is transported by an overhead traveling type conveyance device (OHT), an AGV or an RGV (a floor traveling type conveyance device), a PGV (personal guided conveyance device), or an operator. Meanwhile, the substrate storage 2 may employ various configurations as long as the substrate storage 2 may air-tightly accommodate and convey substrates W. In the exemplary embodiment, an example in which the substrate storage 2 is configured as a front opening unified pod (FOUP) will be described. The FOUP is a substrate storage including a lid on the front side thereof, in which the lid may be opened and closed in an air-tight manner, and may be removed such that substrates W may be introduced into or taken out from the FOUP through the front side.

The load ports 3 and 4 are portions used when the substrate storages 2 accommodating substrates W are carried into (loaded into) or carried out from (unloaded from) the vertical heat treatment apparatus 100. When the substrate storages 2 are placed on the load ports 3 and 4, the carry-in/out of the substrate storages is performed.

The substrate storage temporary shelf 5 is a storage shelf provided for storing the plurality of substrate storages 2 loaded from the load ports 3 and 4, within the substrate storage conveyance area 17.

The substrate holder 6 is a substrate holder that holds a plurality of substrates W in multiple stages. The substrate holder is capable of a large number of (e.g., about 75 to 150) substrates W.

The heat treatment furnace 7 is a processing unit that accommodates the substrate holder 6 holding the plurality of substrates W to perform a predetermined heat treatment on the substrates W. Through the heat treatment, a film formation such as, for example, chemical vapor deposition (CVD), or atomic layer deposition (ALD) is performed on the surfaces of the substrates W.

The FIMS port 8 is a transfer unit configured to transfer substrates W from the substrate storage 2 to the substrate conveyance area 10, and transfers the substrates W between, for example, the substrate storage 2 and the substrate holder 6.

As described above, the vertical heat treatment apparatus 100 includes the casing 9 that forms an outer shell, and the heat treatment furnace 7 is provided at the rear upper portion within the casing 9. The substrate conveyance area 10 is formed below the heat treatment furnace 7. The substrate conveyance area 10 is a work area in which the substrate holder 6 is carried (loaded) into the heat treatment furnace 7, or carried out from (unloaded from) the heat treatment furnace 7, or the substrates W are transferred between the substrate holder 6 and the substrate storage 2 on the FIMS port 8. The heat treatment furnace 7 is mainly constituted with a reaction tube 11 made of, e.g. quartz, a liftable lid 12, and a heater 13. The reaction tube 11 is a vertically elongated processing container having a lower portion opened as a furnace opening 11a. The lid 12 air-tightly closes the furnace opening (opening portion) 11a of the reaction tube 11 from the lower side in an openable manner. The heater 13 is provided to cover the periphery of the reaction tube 11, and is composed of a resistance heating element that is a heating mechanism capable of heating and controlling the inside of the reaction tube 11 to a predetermined temperature, e.g., 300° C. to 1200° C.

A base plate 14 made of, for example, SUS, is horizontally provided within the casing 9 in order to place the reaction tube 11 or the heater 13 constituting the heat treatment furnace 7 thereon. An opening (not illustrated) through which the reaction tube 11 is inserted from the lower side to the upper side is formed in the base plate 14. An outward flange portion is formed in the lower end portion of the reaction tube 11, and is held by the base plate 14 through a flange holding member such that the reaction tube 11 is provided in the state of being upwardly inserted into the opening of the base plate 14 from the lower side. The reaction tube 11 is connected to a plurality of gas introducing pipes that introduce a processing gas or an inert gas (e.g., N2) for purging into the reaction tube 11 or an exhaust pipe having, for example, a vacuum pump or a pressure control valve which is capable of controlling the reduction of pressure inside the reaction tube 11 (not illustrated).

A lift mechanism 15 configured to raise and lower the lid 12 is provided in the substrate conveyance area 10 so as to carry the substrate holder 6 into or out of the heat treatment furnace 7. A rotating mechanism is provided below the lid 12 to rotate the substrate holder 6. The substrate holder 6 is made of, for example, quartz. The substrate holder 6 in the illustrated example includes a substrate holder main body 6a that vertically supports large-diameter substrates W (e.g., a diameter of 300 mm) in a horizontal state, at predetermined intervals in multiple stages, and a leg portion 6b connected to a rotating shaft of the rotating mechanism to horizontally rotate the substrate holder main body 6a. A furnace opening heating mechanism or a heat insulating cylinder (not illustrated) is provided in the lid 12.

In the substrate conveyance area 10, a shutter mechanism (not illustrated) is provided to shield (heat-shield) the furnace opening 11a which is opened by unloading, and a transfer mechanism 16 is provided to transfer substrates W between the unloaded substrate holder 6 and the substrate storage 2 on the FIMS port 8. The substrate storage conveyance area 17 is formed in the front portion within the casing 9 so as to convey and store the substrate storages, the FIMS port 8 is formed at the lower portion within the substrate storage conveyance area 17, and a partition wall 18 is provided within the casing 9 to partition the substrate conveyance area 10 and the substrate storage conveyance area 17.

The FIMS port 8 includes: a placing table 8a on which the substrate storage 2 is placed; a fixing mechanism configured to fix the substrate storage 2 in a state where the peripheral portion of the front side of the container main body of the substrate storage 2 is in close contact with the partition wall 18; an opening (not illustrated) through which the inside of the substrate storage 2 communicates with the inside of the substrate conveyance area 10; an openable door 19 that air-tightly closes the opening from the substrate conveyance area 10 side; and a lid opening/closing mechanism configured to open and close the lid of the substrate storage 2 (not illustrated). Although not illustrated in FIG. 1, two FIMS ports 8 may be provided at the left and right sides such that the two substrate storages 2 may be placed.

The substrate storage temporary shelf 5 is provided in the rear portion within the substrate storage conveyance area 17. In the illustrated example, the substrate storage temporary shelf 5 includes three stages of placing shelves 5a, 5b, and 5c, at the upper stage, the middle stage, and the lower stage, and two (left and right) substrate storages 2 may be placed and stored on each of the shelves. Within the substrate storage conveyance area 17, a substrate storage transfer (conveyance mechanism) 21 is provided to convey and transfer the substrate storages 2 among the load ports 3 and 4, the substrate storage temporary shelf 5, the FIMS port 8, and a second substrate storage temporary shelf 20 to be described below.

The load ports 3 and 4 are formed in two stages (upper and lower stages) on the front side of the casing 9 (the front side of the substrate processing apparatus). The upper-stage load port 3 includes a placing table 3a on which the substrate storage 2 is placed, and an opening 3b through which the substrate storage 2 is carried into and out from the substrate storage conveyance area 17. An overhead traveling type conveyance device is used to convey the substrate storage 2 into the upper-stage load port 3 or to carry the substrate storage 2 out of the upper-stage load port 3. The lower-stage load port 4 includes a table 4a on which the substrate storage 2 is placed, and an opening 4b through which the substrate storage 2 is carried into and out of the substrate storage conveyance area 17. A floor traveling type conveyance device or an operator conveys the substrate storage 2 into the lower-stage load port 4, or carries the substrate storage 2 out of the lower-stage load port 4. Two (left and right) substrate storages 2 may be placed on each of the upper-stage load port 3 and the lower-stage load port 4.

The substrate storage temporary shelf 20 is provided between the upper-stage and lower-stage load ports 3 and 4 so as to accommodate and store the substrate storage 2. The substrate storage temporary shelf 20 is configured to accommodate and place the substrate storage 2 thereon using a space between the upper-stage and lower-stage load ports 3 and 4. An input/output display of a controller 22, e.g., a touch-panel type display device 23 may be provided on the front side of the casing 9, that is, the front wall portion between the upper-stage and lower-stage load ports 3 and 4. The controller 22 performs various controls of the vertical heat treatment apparatus 100 such as, for example, a control of a substrate storage conveyance, a control of a substrate transfer, and a processor control of a heat treatment.

Meanwhile, the controller 22 is configured as a computer including, for example, a central processing unit (CPU), and a memory such as, for example, a read only memory (ROM), and a random access memory (RAM). A program used for performing a substrate processing described below is stored in the memory of the controller 22. In the program, a group of steps is set up to execute various operations of the substrate processing apparatus. The program is installed from a storage unit 24, that is a storage medium such as, for example, a hard disk, a compact disk, a magneto-optical disk, a memory card, or a flexible disk, into the controller 22.

In FIG. 1, a block diagram of the internal configuration of the controller 22 is also illustrated. The controller 22 includes a time measuring unit 22a that measures a time, and an integrated flow rate calculator 22b that calculates an integrated flow rate of a purge gas. Meanwhile, these functions will be described below.

Hereinafter, the configuration and function of the substrate storage temporary shelves 5 and 20 will be described in more detail.

Figure 2:
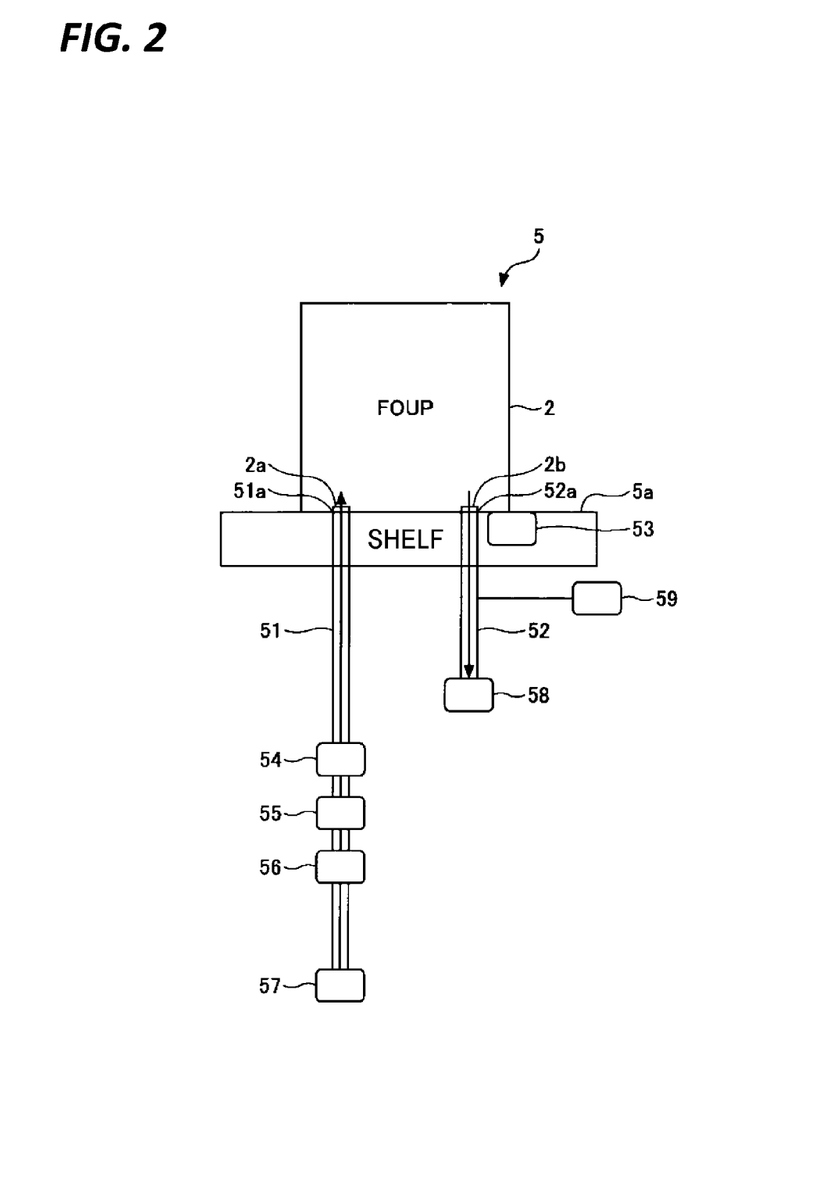
FIG. 2 is a view illustrating an exemplary configuration of a substrate storage temporary shelf of the substrate processing apparatus according to the exemplary embodiment of the present disclosure.

FIG. 2 is a view illustrating an example of the configuration of the substrate storage temporary shelf 5a of the substrate processing apparatus according to the exemplary embodiment of the present disclosure. Meanwhile, in FIG. 2, the substrate storage temporary shelf 5a will be described as an example, but other substrate storage temporary shelves 5b, 5c, and 20 are configured similarly.

The substrate storage temporary shelf 5a is configured in a shelf form, and is configured such that the substrate storage 2 such as the FOUP may be placed on the top surface of the substrate storage temporary shelf 5a and may be temporarily stored. The substrate storage temporary shelf 5a includes a purge gas supply pipe 51 and an exhaust pipe 52. The substrate storage temporary shelf 5a includes, as necessary, a substrate storage detection switch 53, a filter 54, a control valve 55, a flow rate regulator 56, a purge gas supply source 57, a vacuum pump 58, and a pressure gauge 59.

The purge gas supply pipe 51 is a unit for supplying a purge gas into the substrate storage 2. Two communication ports 2a and 2b are formed in the bottom face of the substrate storage 2 so that the purge gas may be supplied into the substrate storage 2 when the substrate storage 2 is placed on the substrate storage temporary shelf 5a. An upper-end supply port 51a of the purge gas supply pipe 51 is formed at a position where the supply port 51a communicates with one communication port 2a when the substrate storage 2 is placed on the substrate storage temporary shelf 5a, and an upper-end exhaust port 52a of the exhaust pipe 52 is formed at a position where the exhaust port 52a communicates with the other communication port 2b of the substrate storage 2. Accordingly, when the substrate storage 2 is stored on the substrate storage temporary shelf 5a, the purge gas may be supplied into the substrate storage 2. Meanwhile, the purge gas supply pipe 51 and the exhaust pipe 52 are formed through, for example, the substrate storage temporary shelf 5a.

The substrate storage detection switch 53 is a storage detection unit configured to detect that the substrate storage 2 is placed (stored) on the substrate storage temporary shelf 5a. For example, when the substrate storage 2 is placed on the substrate storage detection switch 53, the substrate storage detection switch 53 is turned ON and the storing of the substrate storage 2 is detected. The detection signal of the substrate storage detection switch 53 is sent to the controller 22 described above.

When receiving the ON signal from the substrate storage detection switch 53, the controller 22 performs a control to supply the purge gas to the purge gas supply pipe 51. Specifically, the control valve 55 is opened, and the supply flow rate is adjusted by the flow rate regulator 56. The purge gas is supplied into the substrate storage 2 from the purge gas supply source 57 through the purge gas supply pipe 51. Here, the purge gas is supplied in a cleaned state via the filter 54. Meanwhile, as the purge gas, for example, an inert gas containing a rare gas is used, but, here, an example in which a nitrogen gas is used will be described.

As the nitrogen gas is supplied into the substrate storage 2, oxygen within the substrate storage 2 is replaced with nitrogen, and the oxygen concentration gradually decreases. Meanwhile, the displaced oxygen gas is exhausted to the exhaust pipe 52 through the exhaust port 52a. An exhaust unit such as, for example, the vacuum pump 58 is connected to the downstream side of the exhaust pipe 52. As necessary, the pressure gauge 59 may be provided in the exhaust pipe 52 to measure the pressure within the substrate storage 2. A control valve (not illustrated) may be provided in the exhaust pipe 52. As described above, through the supply of the purge gas, the oxygen within the substrate storage 2 may be replaced with the purge gas, thereby decreasing the oxygen concentration within the substrate storage 2.

Here, when determining the set flow rate of the flow rate regulator 56 and measuring the time during which the purge gas is supplied to the substrate storage 2, the controller 22 may calculate the integrated flow rate of the purge gas supplied into the substrate storage 2. The time measurement may be performed by the time measuring unit 22a of the controller 22, and the calculation of the integrated flow rate may be performed by the integrated flow rate calculator 22b. For example, a simple timer is sufficient for the time measuring unit 22a. An operation of the integrated flow rate calculator 22b is performed by simply multiplying the flow rate of the flow rate regulator 56 by the integration time, and thus the integrated flow rate may be easily calculated.

The supply of the purge gas may be continued as long as the substrate storage 2 is stored on the substrate storage temporary shelf 5a, or the supply may be stopped when the oxygen concentration within the substrate storage 2 becomes a predetermined threshold value or less. Details of such a specific control method will be described below. Next, the configuration of the FIMS port will be described.

Figure 3:
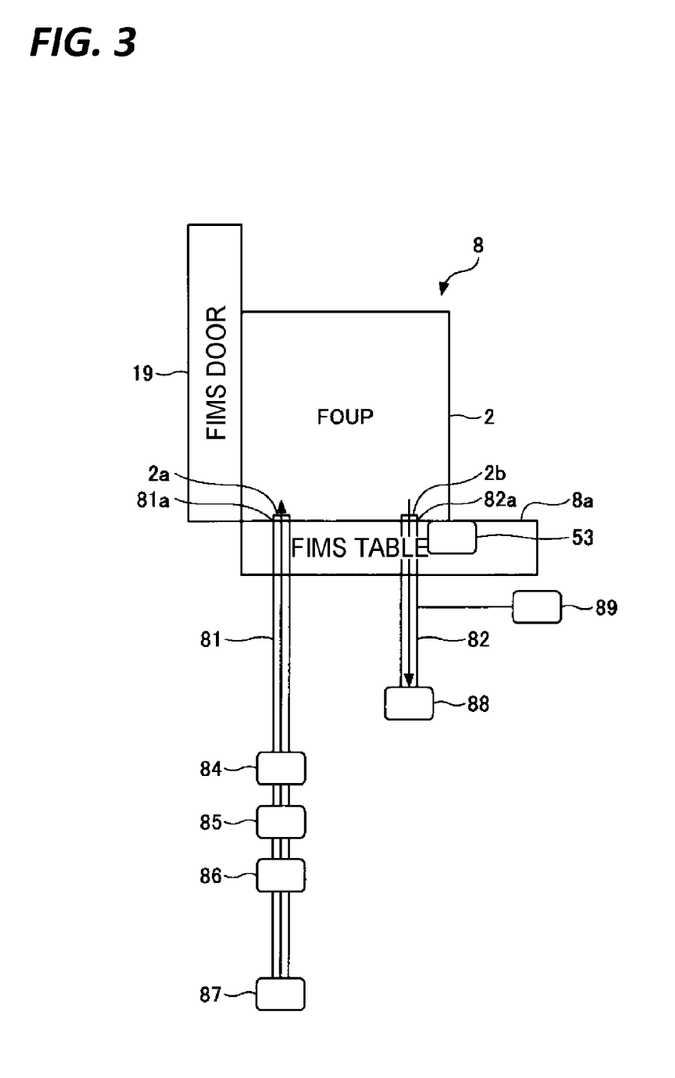
FIG. 3 is a view illustrating an exemplary configuration of an FIMS port in the substrate processing apparatus according to the exemplary embodiment of the present disclosure.

FIG. 3 is a view illustrating an example of the configuration of the FIMS port 8 in the substrate processing apparatus according to the exemplary embodiment of the present disclosure. In the FIMS port 8, when the substrate storage 2 is placed on the placing table 8a, the front side of the substrate storage 2 is closely fixed to the openable door 19 by a fixing mechanism (not illustrated), and substrates W may be transferred into the substrate conveyance area 10. In this state, an opening/closing mechanism (not illustrated) opens the openable door 19, and the transfer mechanism 16 transfers the substrates W accommodated in the substrate storage 2 to the substrate holder 6 within the substrate conveyance area 10, so that the substrates W within the substrate storage 2 are transferred into the substrate conveyance area 10 while the infiltration of the outside air is suppressed.

During the transfer, since the inside of the substrate storage 2 communicates with the substrate conveyance area 10, it is required to set the oxygen concentration within the substrate storage 2 to a predetermined threshold value or less. When the oxygen concentration increases, a natural oxide film is formed on the surface of the substrate W, and it is impossible to perform a substrate processing in such a state. Thus, for a process management, it is important to set the oxygen concentration to a predetermined value or less. Since the substrate conveyance area 10 is an area where the substrates W are conveyed in an exposed state, the oxygen concentration is also set to be very low. Meanwhile, the inside of the substrate storage 2 is naturally kept at an oxygen concentration at which the natural oxide film is not generated on the surface of the substrate W, but an oxygen concentration higher than the oxygen concentration of the substrate conveyance area 10 is also acceptable. However, when the oxygen concentration of the substrate conveyance area 10 increases due to the communication with the substrate storage 2 during the transfer of the substrates W, the process is affected. Thus, it is required to replace oxygen by a purge gas and to lower the oxygen concentration to a predetermined threshold value or less prior to the transfer of the substrates W. The FIMS port 8 has such an oxygen replacement function.

Specifically, the FIMS port includes a purge gas supply pipe 81, and an exhaust pipe 82. The FIMS port 8 includes, as necessary, a substrate storage detection switch 83, a filter 84, a control valve 85, a flow rate regulator 86, a purge gas supply source 87, a vacuum pump 88, and a pressure gauge 89. These constituent elements are the same as and correspond to the purge gas supply pipe 51, the exhaust pipe 52, the substrate storage detection switch 53, the filter 54, the control valve 55, the flow rate regulator 56, the purge gas supply source 57, the vacuum pump 58, and the pressure gauge 59 provided in the substrate storage temporary shelf 5a. Accordingly, although a detailed explanation of the functions of these elements is omitted, the substrate storage detection switch 83 detects the placement of the substrate storage 2 and transmits a detection signal to the controller 22, and the control valve 85 is opened by a command from the controller 22. Then, the purge gas is cleaned by the filter 84 and is supplied into the substrate storage 2 from the purge gas supply source 87 through the purge gas supply pipe 81 while the flow rate is adjusted by the flow rate regulator 86. Accordingly, the oxygen within the substrate storage 2 is replaced by the purge gas, and the oxygen and the purge gas are exhausted by the vacuum pump 88 via the exhaust pipe 82. If necessary, the pressure within the substrate storage 2 is measured by the pressure gauge 89. A control valve (not illustrated) may be provided in the exhaust pipe 82 in the same manner as in the substrate storage temporary shelf 5a. Meanwhile, as the purge gas, the same purge gas as the purge gas used for the substrate storage temporary shelves 5 and 20 is used. For example, a nitrogen gas is used. Then, the integrated flow rate of the purge gas supplied into the substrate storage 2 is calculated by the integrated flow rate calculator 22b of the controller 22.

As described above, the FIMS port 8 has the same configuration as the substrate storage temporary shelves 5 and 20, and is configured to lower the oxygen concentration within the substrate storage 2, and grasp the integrated flow rate of the purge gas supplied into the substrate storage 2 in cooperation with the controller 22.

Next, descriptions will be made on a control method of a substrate transfer using the substrate storage temporary shelves 5 and 20 and the FIMS port 8. In the substrate processing apparatus and the substrate transfer method according to the exemplary embodiment of the present disclosure, in order to manage the oxygen concentration, the oxygen concentration within the substrate storage 2 is calculated (estimated) using the integrated flow rate of a purge gas and the time during which the purge gas is not supplied without using an oxygen concentration meter. When the oxygen concentration meter is used, the oxygen within the substrate storage 2 may be accurately measured, but it takes time to perform a measurement, and thus the productivity is deteriorated. Accordingly, in the substrate processing apparatus and the substrate transfer method according to the exemplary embodiment, for example, the replacement characteristic of the purge gas and oxygen in each of the FIMS port 8 and the substrate storage temporary shelves 5 and 20, and the oxygen concentration retention characteristic of the time during which the purge gas is not supplied in the substrate storage temporary shelves 5 and 20 are measured in advance, and based on these characteristics, the oxygen concentration within the substrate storage 2 is determined. Hereinafter, specific contents will be described in detail.

Figure 4:
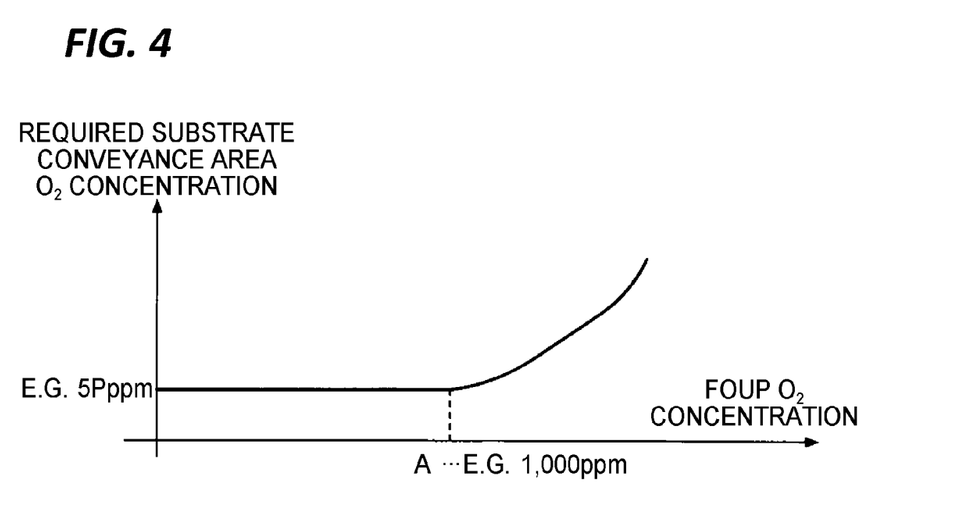
FIG. 4 is a view illustrating an exemplary oxygen concentration within a substrate storage which does not affect an oxygen concentration of a substrate conveyance area.

FIG. 4 is a view illustrating an exemplary oxygen concentration within the substrate storage 2 which does not affect the oxygen concentration of the substrate conveyance area when substrates W are transferred from the substrate storage 2 to the substrate conveyance area 10. In FIG. 4, the horizontal axis indicates an oxygen concentration within the substrate storage 2, and the vertical axis indicates an oxygen concentration within the substrate conveyance area 10.

As illustrated in FIG. 4, when the oxygen concentration within the substrate storage 2 is "A" or less, the oxygen concentration of the substrate conveyance area 10 is constant. Meanwhile, when the oxygen concentration within the substrate storage 2 exceeds "A," the oxygen concentration of the substrate conveyance area 10 also increases. That is, the oxygen concentration of the substrate conveyance area 10 is affected. Accordingly, during the transfer of the substrate storage 2 into the substrate conveyance area 10, when the oxygen concentration within the substrate storage 2 is set to "A" or less, the substrates W may be transferred without any influence on the oxygen concentration within the substrate conveyance area 10. Meanwhile, descriptions may be made by taking specific numbers as an example in order to facilitate the understanding. When the oxygen concentration of the substrate conveyance area 10 is 5 ppm, the oxygen concentration within the substrate storage 2 "A" is about 1000 ppm. Although the digits of both numbers are greatly different from each other, since the volume of the substrate storage 2 is extremely smaller than the volume of the substrate conveyance area 10, it is not necessary to lower the oxygen concentration within the substrate storage 2 to the same level as the oxygen concentration of the substrate conveyance area 10, and a concentration much higher than the oxygen concentration of the substrate conveyance area 10 may be set as the target value.

Figure 5:
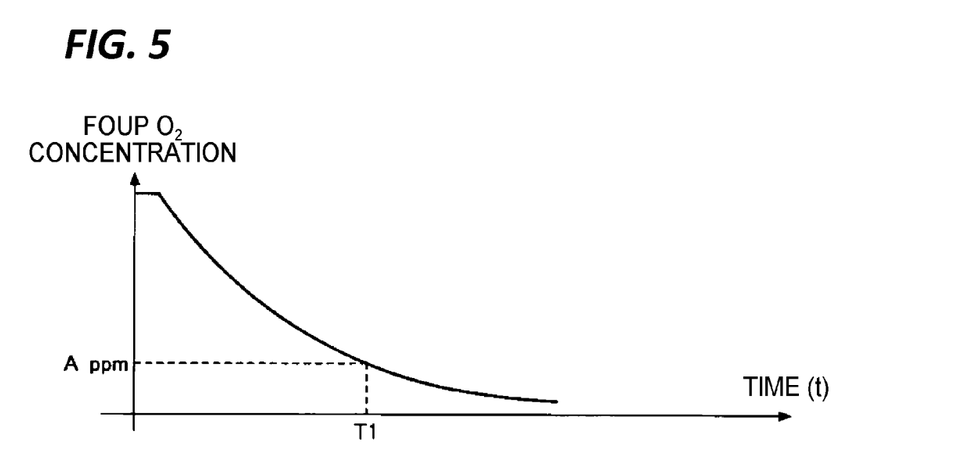
FIG. 5 is a view illustrating an exemplary oxygen replacement characteristic at the FIMS port when a purge gas is supplied.

FIG. 5 is a view illustrating an exemplary oxygen replacement characteristic in the FIMS port 8 when a purge gas is supplied. In FIG. 5, the horizontal axis indicates a time, and the vertical axis indicates an oxygen concentration within the substrate storage 2. The inside of the substrate storage 2 is set to a predetermined high oxygen concentration (equal to or higher than a concentration of the substrate storage 2 during the carry-in of the substrate storage 2 into the load port 3 or 4), the substrate storage 2 is placed on the placing table 8a of the FIMS port 8, and the purge gas is supplied into the substrate storage 2 from the purge gas supply pipe 81 at a predetermined flow rate. When the supply is initiated, the purge gas replaces oxygen, and the oxygen concentration gradually decreases and reaches "A" at a certain stage. Then, when the purge gas is continuously supplied thereafter, the oxygen concentration is further decreased. The time required until "A" at this time is reached is a time T1 required until a threshold value "A" is reached in the FIMS port 8 when the purge gas is supplied at a predetermined flow rate. Accordingly, in an actual process, in the case where the substrate storage 2 is carried into the FIMS port 8 without passing through the substrate storage temporary shelf 5 or 20, when the purge gas is supplied at the same flow rate as that in the preliminary measurement illustrated in FIG. 5 for the period of time T1, the oxygen concentration may be caused to reach the threshold value "A." In the actual process, even in the case where the purge gas is supplied at a different flow rate, when the integrated flow rate is set to the same as that in FIG. 5, it is possible to calculate a time required until the threshold value "A" is reached according to an actual flow rate.

Even in the case where the initial oxygen concentration within the substrate storage 2 is smaller than the initial value in FIG. 5, when the supply of the purge gas is initiated at a corresponding position of the oxygen concentration in the graph of FIG. 5, it is possible to calculate the integrated flow rate at which the threshold value "A" may be reached. When the purge gas is supplied at the required integrated flow rate, the threshold value "A" may be reached in a minimum time. Meanwhile, in the actual process, in view of standing on the side of safety, of course, a setting may be employed in which the purge gas is supplied until the oxygen concentration becomes smaller than the threshold value "A." By using the result of the preliminary measurement of FIG. 5, it is possible to manage the oxygen concentration within the substrate storage 2 without performing oxygen measurement.

Figure 6:
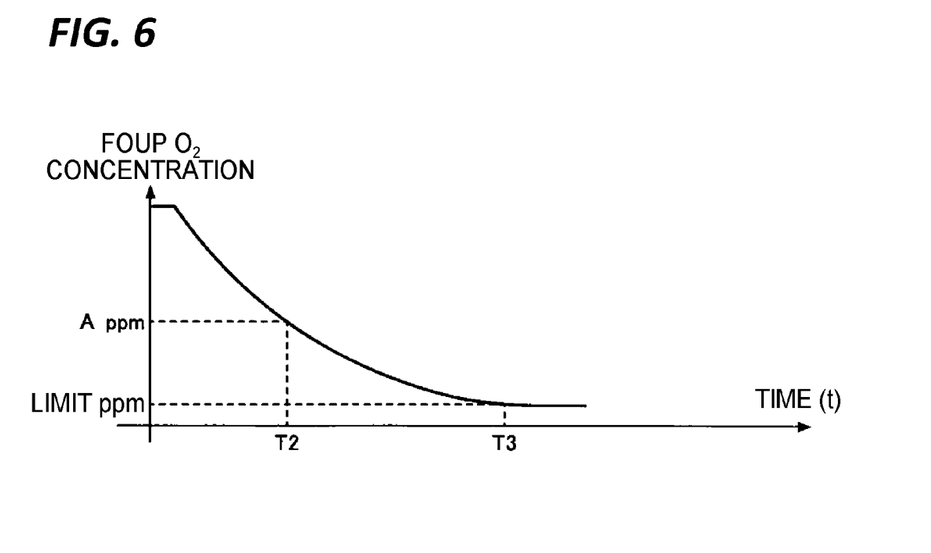
FIG. 6 is a view illustrating an exemplary oxygen replacement characteristic at the substrate storage temporary shelf when a purge gas is supplied.

FIG. 6 is a view illustrating an exemplary oxygen replacement characteristic in the substrate storage temporary shelves 5 and 20 when a purge gas is supplied. In FIG. 6 as well, the horizontal axis indicates a time, and the vertical axis indicates an oxygen concentration within a substrate storage 2. In the preliminary measurement illustrated in FIG. 6, the inside of the substrate storage 2 is set to a predetermined high oxygen concentration (equal to or higher than a concentration of the substrate storage 2 during the carry-in of the substrate storage 2 into the load port 3 or 4), and in a state where the substrate storage 2 is stored on the substrate storage temporary shelf 5 or 20, the purge gas is supplied into the substrate storage 2 from the purge gas supply pipe 51 at a predetermined flow rate. Due to the supply of the purge gas, the oxygen concentration within the substrate storage 2 gradually decreases and reaches a threshold value "A" at time T2. When the purge gas is continuously supplied even thereafter, the oxygen concentration is further decreased. Then, the oxygen replacement characteristic is measured up to a limit value below which the oxygen concentration does not decrease. In the case of the substrate storage temporary shelves 5 and 20, the supply flow rate of the purge gas is generally set to be lower than that in the FIMS port 8. Thus, at such a level of flow rate, in many cases, there may be a limit below which the oxygen concentration does not decrease. Since the preliminary measurement is performed under conditions close to actual process conditions, in most cases, there is a limit value. Accordingly, in the preliminary measurement, such a limit value (a limit oxygen concentration) is also measured. This is because when the oxygen concentration within the substrate storage 2 reaches a limit value, a control of stopping the supply of the purge gas is also possible.

Figure 7:
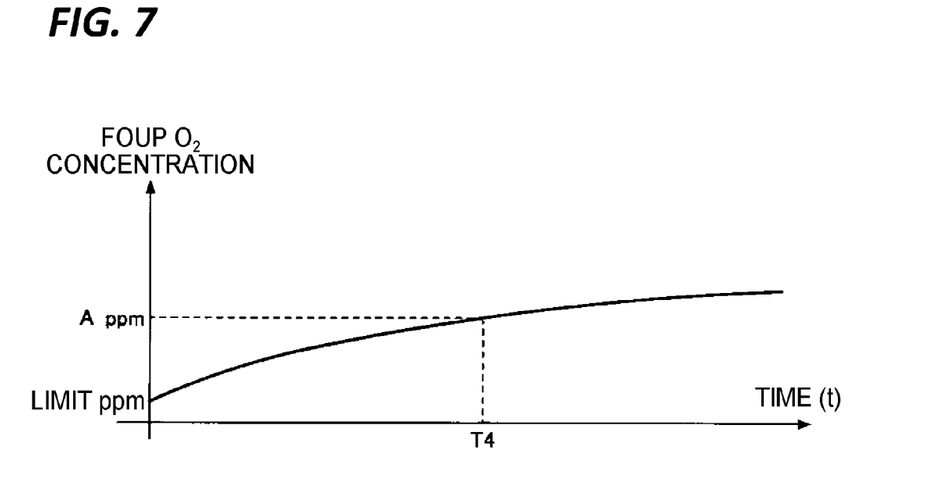
FIG. 7 is a view illustrating an exemplary oxygen concentration retention characteristic in the substrate storage temporary shelf when a purge gas is supplied.

FIG. 7 is a view illustrating an exemplary oxygen concentration retention characteristic in the substrate storage temporary shelves 5 and 20 when a purge gas is supplied. In FIG. 7 as well, the horizontal axis indicates a time, and the vertical axis indicates an oxygen concentration within the substrate storage 2. In FIG. 7, the supply of a purge gas is stopped at a stage where the limit value illustrated in FIG. 6 is reached, and the characteristic of how the oxygen concentration within the substrate storage 2 changes is measured. When the supply of the purge gas is stopped, the oxygen concentration within the substrate storage 2 gradually increases, and reaches the threshold value "A" at time T4. That is, the supply of the purge gas is initiated after the substrate storage 2 is stored on the substrate storage temporary shelf 5 or 20, and the substrate storage detection switch 53 is turned ON, and a control of stopping the supply of the purge gas may be performed when it is determined, from the integrated flow rate of the purge gas supplied into the substrate storage 2, that the inside of the substrate storage 2 reaches the limit value. Therefore, a wasteful purge gas supply is not performed, so that the cost can be lowered. However, when the supply of the purge gas is stopped, the oxygen concentration within the substrate storage 2 increases. Here, such a change has the characteristic as illustrated in FIG. 7, and thus, the oxygen concentration within the substrate storage 2 may be calculated using the characteristic.

Then, when the substrate storage 2 is placed in the FIMS port 8, the oxygen concentration within the substrate storage 2 is calculated using the characteristic in FIG. 7. When the oxygen concentration is equal to or lower than the threshold value "A," the transfer to the substrate conveyance area 10 in such a state is possible. When the oxygen concentration exceeds the threshold value "A," the supply of the purge gas is performed until the oxygen concentration reaches the threshold value "A" using the oxygen replacement characteristic of the FIMS port as illustrated in FIG. 5, and the transfer into the substrate conveyance area 10 may be performed at a stage where the threshold value "A" is reached.

As described above, the supply of the purge gas in the FIMS port 8 and the supply and stop of the purge gas in the substrate storage temporary shelf may be properly combined using the preliminary measurement results of the oxygen replacement characteristic in the FIMS port 8, the oxygen replacement characteristic in the substrate storage temporary shelves 5 and 20, and the oxygen retention characteristic in the substrate storage temporary shelves 5 and 20 as exemplified in FIGS. 5 to 7, so that the oxygen concentration within the substrate storage 2 may become a predetermined threshold value or less.

Such characteristics illustrated in FIGS. 5 to 7, or FIGS. 4 to 7 may be stored in the memory of the controller 22. When an actual control is performed, the stored characteristics may be referred to, and the control may be performed based on the characteristics. New data may be installed from the storage unit 24 to the controller 22 using a storage medium so that characteristics may be added or changed.

In FIG. 4, the threshold value "A" is set to a level at which the oxygen concentration of the substrate conveyance area 10 is not changed when substrates W are transferred to the substrate conveyance area 10 from the substrate storage 2. However, if acceptable in the process, the threshold value "A" may be set to a level at which the oxygen concentration of the substrate conveyance area 10 slightly rises. Since the minimum accessible condition is that a natural oxide film is not formed on the surface of the substrate W, it is possible to further reduce a time required for the purge gas supply so as to further improve the productivity when the threshold value "A" is set to be somewhat higher within a range satisfying the minimum condition.

Next, descriptions will be made on specific examples of a pattern of a purge gas replacement using the characteristics of FIGS. 5 to 7 in combination.

As a precondition, it is assumed that the threshold value "A" at the opening of the substrate storage 2 is 1000 ppm. The substrate storage 2 carried into the load port 3 or 4 is conveyed to the substrate storage temporary shelf 5 or 20 by the substrate storage transfer 21. When the substrate storage 2 is stored on the substrate storage temporary shelf 5 or 20, the substrate storage detection switch 53 is turned ON, and nitrogen gas is supplied from the purge gas supply pipe 51 into the substrate storage 2 by a command of the controller 22, thereby initiating the nitrogen replacement.

As a pattern 1, when the oxygen concentration is lowered to 1000 ppm at the substrate storage temporary shelf 5 or 20 and the substrate storage 2 is immediately moved to the FIMS port 8, the time for a nitrogen replacement in the FIMS port 8 becomes 0 sec.

As a pattern 2, when the oxygen concentration is lowered to 2000 ppm in the substrate storage temporary shelf 5 or 20 and the substrate storage 2 is immediately moved to the FIMS port 8, a nitrogen replacement is performed for a period of time required to lower the oxygen concentration from 2000 ppm to 1000 ppm in the FIMS port 8. That is, the oxygen replacement characteristic according to the supply of the purge gas as illustrated in FIG. 5 is performed until the oxygen concentration reaches from 2000 ppm to "A."

As a pattern 3, when the oxygen concentration is lowered to 10 ppm in the substrate storage temporary shelf 5 or 20 and the oxygen concentration does not exceed 1000 ppm even after the substrate storage 2 is left for 30 min, the time for a nitrogen replacement in the FIMS port 8 becomes 0 sec.

As a pattern 4, when the oxygen concentration is lowered to 10 ppm in the substrate storage temporary shelf 5 or 20 and the oxygen concentration reaches 2000 ppm even after the substrate storage 2 is left for 90 min, a nitrogen replacement is performed for a period of time required to lower the oxygen concentration from 2000 ppm to 1000 ppm in the FIMS port 8. The same operation in the above-described pattern 2 is performed in the FIMS port 8.

Unlike the precondition, when the substrate storage 2 is directly conveyed from the load port 3 or 4 to the FIMS port 8 without passing through the substrate storage temporary shelf 5 or 20, the oxygen concentration is lowered to 1000 ppm according to FIG. 5.

As described above, the supply and stop of the purge gas at the substrate storage temporary shelf 5 or 20 and the supply of the purge gas at the FIMS port 8 may be properly combined so as to lower the oxygen concentration within the substrate storage 2 according to the applications and situations.

Then, according to the substrate processing apparatus and the substrate transfer method according to the exemplary embodiment, it is possible to determine the oxygen concentration within the substrate storage 2 without actually measuring the oxygen concentration, and to perform a proper transfer of the substrates W while shortening the oxygen measurement time, thereby improving the productivity.

Figure 8:
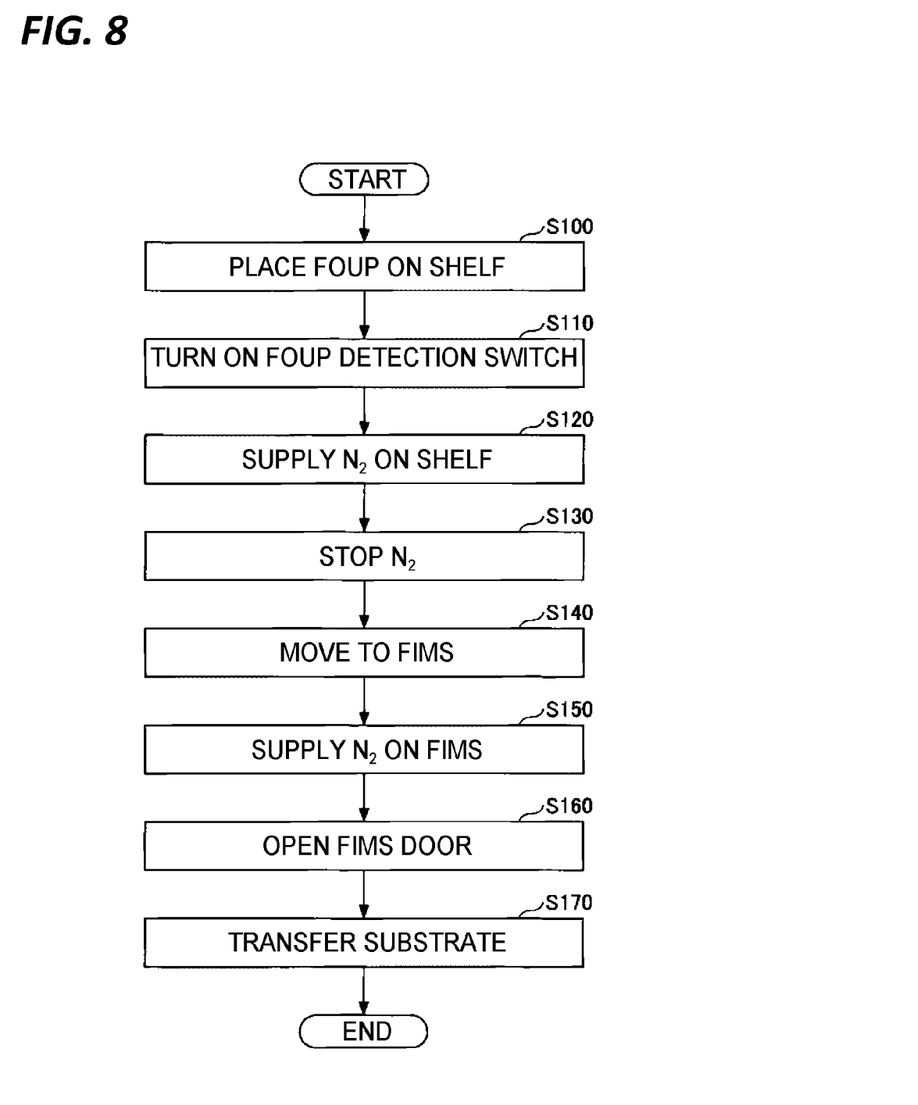
FIG. 8 is a flow chart illustrating an exemplary substrate transfer method according to the exemplary embodiment of the present disclosure.

Hereinafter, descriptions will be made of a substrate transfer method, in which the above-described various patterns are collectively described, with reference to FIG. 8. FIG. 8 is a flow chart illustrating an exemplary substrate transfer method according to the exemplary embodiment of the present disclosure. Meanwhile, in the example of FIG. 8, descriptions will be made of an example in which the substrate storage 2 is a FOUP and the purge gas is nitrogen. However, this example is exemplary only, and various substrate storages 2 and purge gases may be employed.

In step S100, the substrate storage (FOUP) 2 is placed on the substrate storage temporary shelf 5 or 20.

In step S110, the substrate storage detection switch 53 is turned ON, and a detection signal is sent to the controller 22.

In step S120, nitrogen gas is supplied from the purge gas supply pipe 51 into the substrate storage 2 according to a command of the controller 22. Accordingly, within the substrate storage 2, a replacement of oxygen by the purge gas is initiated. Here, the supply time of the purge gas is measured by the time measuring unit 22a of the controller 22, and the integrated supply flow rate is calculated and determined by the integrated flow rate calculator 22b.

In step S130, the supply of the nitrogen gas as the purge gas is stopped. The supply may be stopped at a point of time when the limit value illustrated in FIG. 6 is reached or a predetermined threshold value set according to a process is reached. The threshold value may be equal to or different from the threshold value "A" during the transfer of substrates W from the FIMS port 8 to the substrate conveyance area 10. That is, besides the threshold value "A" during the transfer, a threshold value for the substrate storage temporary shelves 5 and 20 may be set. The threshold value for the substrate storage temporary shelves 5 and 20 may be a limit value below which the oxygen concentration does not decrease or may be set to a value other than the limit value.

The step S130 is an arbitrary step that may or may not be provided. That is, in the substrate storage temporary shelf 5 or 20, the supply of the purge gas may be continuously performed without being stopped until the substrate storage 2 is unloaded. Meanwhile, when the substrate storage 2 is unloaded, the substrate storage detection switch 53 is turned OFF, and the supply of the purge gas is stopped under the control of the controller 22.

In step S140, the substrate storage 2 is conveyed from the substrate storage temporary shelf 5 or 20 to the FIMS port 8 by the substrate storage transfer 21, and is placed on the placing table 8a. Here, the substrate storage detection switch 83 is turned ON, and the detection signal is sent to the controller 22. When receiving the detection signal, the controller 22 calculates the oxygen concentration of the substrate storage 2 placed on the FIMS port 8. The oxygen concentration may be calculated based on the integrated supply flow rate of the purge gas in the substrate storage temporary shelf 5 or 20 and the increase amount of the oxygen concentration at the stop of the purge gas supply which are calculated using FIGS. 6 and 7.

In step S150, the supply of the purge gas into the substrate storage 2 is performed in the FIMS port 8. Meanwhile, in step S140, when the controller 22 determines that the oxygen concentration within the substrate storage 2 is the threshold value "A" or less and that it is possible to perform the transfer into the substrate conveyance area 10 in such a state, the step S150 may be omitted.

Meanwhile, when the controller 22 determines that the oxygen concentration of the substrate storage 2 in the FIMS port 8 exceeds the threshold value "A," the supply of the purge gas is initiated. The supply of the purge gas is performed by calculating a time required until the threshold value "A" is reached based on the characteristic of FIG. 5.

In step S160, the openable door 19 is opened and the lid of the substrate storage 2 is opened, so that the substrate storage 2 communicates with the substrate conveyance area 10.

In step S170, the transfer of the substrates W from the substrate storage 2 to the substrate holder 6 is performed by the transfer mechanism 16. In the case of a substrate processing apparatus that is not provided with the substrate holder 6, the substrates W are transferred to a predetermined place within the substrate conveyance area 10.

Meanwhile, in steps S100 to S130, the substrate storage 2 may not be conveyed to the substrate storage temporary shelf 5 or 20 and the supply of the purge gas may not be performed at the substrate storage temporary shelf 5 or 20, while the substrate storage 2 may be directly conveyed from the load port 3 or 4 to the FIMS port 8. In this case, the processing flow starts from the step S140.

As described above, in the substrate processing apparatus and the substrate transfer method according to the exemplary embodiment, it is possible to determine the oxygen concentration through time management without measuring the oxygen concentration within the substrate storage 2, and to perform the transfer of the substrates W without losing time. Accordingly, it is possible to improve the productivity without deteriorating the quality of the process. An unnecessary purge gas supply may be stopped, thereby achieving an energy saving and a cost reduction of the process. The replacement of a gas outgassing from processed substrates may also be performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a substrate conveyance area having a first oxygen concentration, in which a substrate is conveyable in an exposed state;
a substrate storage conveyance area formed adjacent to the substrate conveyance area via a partition wall, and having a second oxygen concentration higher than the first oxygen concentration, in which the substrate held within a substrate storage is conveyable;
a substrate storage storing shelf provided within the substrate storage conveyance area and configured to temporarily store the substrate storage;
a first purge gas supply unit configured to supply a purge gas into the substrate storage stored on the substrate storage storing shelf;
an integrated flow rate acquiring unit configured to acquire an integrated flow rate of the purge gas supplied into the substrate storage from the first purge gas supply unit;
a conveyance unit configured to convey the substrate storage within the substrate storage conveyance area;
a transfer and placement unit provided at a predetermined place adjacent to the partition wall within the substrate storage conveyance area, on which the substrate storage is placed to be transferred to the substrate conveyance area;
a second purge gas supply unit configured to supply a purge gas into the substrate storage placed on the transfer and placement unit;
a substrate transfer unit configured to transfer the substrate into the substrate conveyance area when the substrate storage is opened in a state where the substrate storage placed on the transfer and placement unit is in close contact with the partition wall; and
a controller configured to: stop supplying the purge gas from the first purge gas supply unit when it is determined that an oxygen concentration within the substrate storage is reduced to a predetermined second threshold value or less; calculate an oxygen concentration within the substrate storage placed on the transfer and placement unit based on the integrated flow rate of the purge gas acquired by the integrated flow rate acquiring unit and a time from when the purge gas was stopped, without using an oxygen concentration meter; transfer the substrate to the substrate conveyance area by the substrate transfer unit when the oxygen concentration is a predetermined threshold value or less; supply the purge gas into the substrate storage by the second purge gas supply unit when the oxygen concentration exceeds the predetermined threshold value; and transfer the substrate to the substrate conveyance area by the substrate transfer unit after the oxygen concentration within the substrate storage becomes the predetermined threshold value or less.

2. The substrate processing apparatus of claim 1, wherein the predetermined threshold value is set to a concentration that is higher than the first oxygen concentration but does not change the first oxygen concentration of the substrate conveyance area to a concentration at which a natural oxide film is formed on a surface of the substrate even when the substrate storage is opened.

3. The substrate processing apparatus of claim 1, wherein the integrated flow rate acquiring unit is provided within the controller, and
the controller is configured to control an operation of the first purge gas supply unit and an operation of the conveyance unit as well.

4. The substrate processing apparatus of claim 3, further comprising:

a substrate storage storing detection unit configured to detect that the substrate storage is stored on the substrate storage storing shelf,
wherein when storing of the substrate storage is detected by the substrate storage storing detection unit, the controller initiates a supply of the purge gas by the first purge gas supply unit.

5. The substrate processing apparatus of claim 3, wherein the predetermined second threshold value is based on the acquired integrated flow rate.

6. The substrate processing apparatus of claim 5, wherein the predetermined threshold value and the predetermined second threshold value are set to a same concentration.

7. The substrate processing apparatus of claim 1, further comprising:
a substrate storage placement detection unit configured to detect that the substrate storage is placed on the transfer and placement unit,
wherein the controller is configured to calculate the oxygen concentration when placement of the substrate storage is detected by the substrate storage placement detection unit.

8. The substrate processing apparatus of claim 1, wherein the controller is configured to calculate the oxygen concentration within the substrate storage based on an oxygen replacement characteristic according to a supply of the purge gas from the first purge gas supply unit and an oxygen concentration retention characteristic when the supply of the purge gas is stopped at the substrate storage storing shelf, and an oxygen replacement characteristic according to a supply of the purge gas from the second purge gas supply unit in the transfer and placement unit which are measured in advance.

9. The substrate processing apparatus of claim 8, wherein the oxygen replacement characteristic according to the supply of the purge gas from the first purge gas supply unit, the oxygen concentration retention characteristic when the supply of the purge gas is stopped, and the oxygen replacement characteristic according to the supply of the purge gas from the second purge gas supply unit in the transfer and placement unit are characteristics in which a horizontal axis is a time, and a vertical axis is an oxygen concentration.

10. The substrate processing apparatus of claim 1, wherein the purge gas is nitrogen gas.

11. The substrate processing apparatus of claim 1, wherein a plurality of substrate storage storing shelves are provided.

12. The substrate processing apparatus of claim 1, wherein the substrate storage is an FOUP that has an openable lid provided on a front side thereof, and is configured to accommodate a plurality of substrates, and
the substrate transfer unit is configured to open the lid to open the substrate storage.

13. The substrate processing apparatus of claim 1, wherein a processing container configured to process the substrate is provided in the substrate conveyance area.

14. The substrate processing apparatus of claim 13, wherein the processing container is a reaction tube configured to perform a heat treatment,
a substrate holder configured to be accommodatable in the reaction tube in a state of holding a plurality of substrates is provided in the substrate conveyance area, and
the substrate transfer unit is configured to transfer the substrates from the substrate storage to the substrate holder.

15. A substrate transfer method comprising:
temporarily storing a substrate storage accommodating a substrate on a substrate storage storing shelf provided within a substrate storage conveyance area;
supplying a purge gas into the substrate storage stored on the substrate storage storing shelf;
calculating an integrated flow rate of the purge gas supplied into the substrate storage;
stopping the supplying of the purge gas when it is determined that the oxygen concentration within the substrate storage stored on the substrate storage storing shelf reaches a predetermined second threshold value or less in the calculating of the integrated flow rate of the purge gas supplied into the substrate storage;
placing the substrate on a transfer and placement unit within the substrate storage conveyance area provided adjacent to a partition wall configured to partition a substrate conveyance area and the substrate storage conveyance area in order to transfer the substrate to the substrate conveyance area in which the substrate is conveyable in an exposed state;
calculating an oxygen concentration within the substrate storage placed on the transfer and placement unit based on the integrated flow rate of the purge gas and a time from when the purge gas was stopped without using an oxygen concentration meter, transferring the substrate into the substrate conveyance area by opening the substrate storage in a state where the substrate storage is in close contact with the partition wall when the oxygen concentration is a predetermined threshold value or less, supplying the purge gas into the substrate storage when the oxygen concentration exceeds the predetermined threshold value, and transferring the substrate to the substrate conveyance area after the oxygen concentration within the substrate storage becomes the predetermined threshold value or less.

16. The substrate transfer method of claim 15, wherein the predetermined threshold value is set to a concentration that is higher than an oxygen concentration within the substrate conveyance area, but does not change the oxygen concentration within the substrate conveyance area to a concentration at which a natural oxide film is formed on a surface of the substrate even when the substrate storage is opened.

17. The substrate transfer method of claim 15, wherein the oxygen concentration within the substrate storage placed on the transfer and placement unit is calculated based on an oxygen replacement characteristic according to a supply of the purge gas, an oxygen concentration retention characteristic when the supply of the purge gas is stopped at the substrate storage storing shelf, and an oxygen replacement characteristic according to a supply of the purge gas in the transfer and placement unit wherein the oxygen replacement characteristic, the oxygen concentration retention characteristic, and the oxygen replacement characteristic are measured in advance.

18. The substrate transfer method of claim 17, wherein the oxygen replacement characteristic according to the supply of the purge gas, the oxygen concentration retention characteristic when the supply of the purge gas is stopped at the substrate storage storing shelf, and the oxygen replacement characteristic according to the supply of the purge gas in the transfer and placement unit are characteristics in which a horizontal axis is a time, and a vertical axis is an oxygen concentration.

* * * * *